(12) United States Patent　　(10) Patent No.:　US 12,672,456 B2
Xia et al.　　　　　　　　　　　(45) Date of Patent:　Jun. 30, 2026

(54) ARRAY SUBSTRATE AND TRANSPARENT ORGANIC LIGHT EMITTING DISPLAY PANEL

(71) Applicant: HKC CORPORATION LIMITED, Shenzhen (CN)

(72) Inventors: Xingda Xia, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 285 days.

(21) Appl. No.: 18/213,260

(22) Filed: Jun. 22, 2023

(65) Prior Publication Data

US 2023/0422572 A1　　Dec. 28, 2023

(30) Foreign Application Priority Data

Jun. 23, 2022　(CN) .......................... 202210728030.9

(51) Int. Cl.
*H10K 59/35*　　　(2023.01)
(52) U.S. Cl.
CPC ......... *H10K 59/353* (2023.02); *H10K 59/352* (2023.02)
(58) Field of Classification Search
CPC .. H10K 59/353; H10K 59/352; H10K 59/351; G09F 9/335
See application file for complete search history.

(56) References Cited

U.S. PATENT DOCUMENTS

| | | | |
|---|---|---|---|
| 2018/0175121 A1 | 6/2018 | Ji et al. | |
| 2020/0211486 A1 | 7/2020 | Wang et al. | |
| 2020/0357864 A1* | 11/2020 | Xiao ................... | H10K 59/353 |
| 2021/0384270 A1 | 12/2021 | Liu et al. | |
| 2022/0013598 A1 | 1/2022 | Park et al. | |
| 2023/0037762 A1 | 2/2023 | Ma et al. | |

FOREIGN PATENT DOCUMENTS

| | | |
|---|---|---|
| CN | 104835832 A | 8/2015 |
| CN | 109671405 A | 4/2019 |
| CN | 109817665 A | 5/2019 |
| CN | 110323259 A | 10/2019 |
| CN | 111223463 A | 6/2020 |
| CN | 111883559 A | 11/2020 |
| CN | 112436048 A | 2/2021 |
| CN | 114488591 A | 5/2022 |
| WO | 2022022032 A1 | 2/2022 |
| WO | 2022083347 A1 | 4/2022 |

* cited by examiner

*Primary Examiner* — Elmito Breval

(74) *Attorney, Agent, or Firm* — Franklin & Associates International Inc; Matthew F. Lambrinos

(57)　　　　　ABSTRACT

The present application discloses a pixel structure and a display panel. The pixel structure comprises a plurality of repeating units arranged repeatedly, each repeating unit comprising two pixel units which are in the same shape and adjacent to each other, each pixel unit being in a triangular shape, and each pixel unit comprising: a plurality of sub-pixels, including a first sub-pixel, a second sub-pixel and a third sub-pixel which are in different colors, the first sub-pixel, the second sub-pixel and the third sub-pixel being respectively located between one side of the pixel unit and the center of the pixel unit; and at least one first light-transmitting portion, each of the first light-transmitting portions being located at a vertex of the pixel unit, and within each repeating unit, the two pixel units having coincident sides that are equal in length and coincident.

13 Claims, 2 Drawing Sheets

ARRAY SUBSTRATE AND TRANSPARENT ORGANIC LIGHT EMITTING DISPLAY PANEL

CROSS-REFERENCE TO RELATED APPLICATIONS

The present disclosure claims all the benefits of the Chinese patent application No. 202210728030.9, filed on Jun. 23, 2022 before the China National Intellectual Property Administration of the People's Republic of China, entitled "Array Substrate and Transparent Organic Light Emitting Display Panel", the contents of which is explicitly incorporated herein by reference in their entirety.

FIELD

The present disclosure relates to the field of display technology, particularly to an array substrate and a transparent organic light emitting display panel.

BACKGROUND

An organic light emitting diode (OLED) has become a third generation display technology after a liquid crystal display due to display characteristics of spontaneous light emitting, a large viewing angle, a wide color gamut, short reaction time and high contrast, and advantages of lightness and thinness, flexibility, and the like.

As the display technology continues advancing, in order to meet different needs of people for the display panel, a transparent display panel is proposed. People can see articles placed behind through the transparent organic electroluminescent display panel, and information can be displayed on the transparent display panel, which can be applied to show window display. A customer can see commodities placed behind through the transparent display panel, and information of the commodities can be displayed on the transparent display panel, which is very convenient. Since LCD is a non-autonomous light emitting display mode, a transparent display panel thereof requires an additional backlight, thereby limiting application thereof to a special scene. The OLED light emitting display panel which is an autonomous light emitting mode is light and thin, and greatly riches application scenes thereof.

In general, a transparent OLED display panel comprises a display area and a transparent area, wherein the display area is used for displaying information, the display area comprises several rectangular sub-pixel regions, and each pixel cell of the OLED display is generally composed of a red sub-pixel (R sub-pixel), a green sub-pixel (G sub-pixel), and a blue sub-pixel (B sub-pixel); the transparent area comprises several rectangular transparent pixel regions. The sub-pixel region and the transparent pixel region are distributed in different rows, and the sub-pixel region and the transparent region are alternately arranged in an array overall. When the display panel is turned on, the display panel generates an obvious interlacing effect and a poor perspective effect in visual, which affects a visual experience effect of a user.

SUMMARY

The present disclosure is intended to solve the technical problems in the related art. To this end, the present disclosure proposes an array substrate and a transparent organic light emitting display panel, which can eliminate the drawback of interlacing display while enabling diffraction intensity of the transparent sub-pixels to be weaker, thereby improving the perspective effect of the display panel.

In a first aspect, the present disclosure provides an array substrate comprising a substrate and a plurality of pixel units arranged in an array on the substrate, wherein the pixel units comprise a first row sub-pixel group, a second row sub-pixel group, a third row sub-pixel group, and a fourth row sub-pixel group arranged in a column direction, the first row sub-pixel group and the third row sub-pixel group each comprise at least one first color sub-pixel and at least one second color sub-pixel, and the second row sub-pixel group and the fourth row sub-pixel group each comprise at least one third color sub-pixel and at least one transparent sub-pixel.

In the array substrate according to the present disclosure, the transparent sub-pixel and the third color sub-pixel are in the same row so as to space a plurality of the transparent sub-pixels apart by the third color sub-pixels, thereby preventing a visual effect of a user from being affected.

In a second aspect, the present disclosure provides a transparent organic light emitting display panel comprising the array substrate in the first aspect of the present disclosure.

In the transparent organic light emitting display panel according to the present disclosure, the transparent sub-pixel and the third color sub-pixel are in the same row so as to space a plurality of the transparent sub-pixels apart by the third color sub-pixels, thereby preventing a visual effect of a user from being affected.

BRIEF DESCRIPTION OF THE DRAWINGS

The accompanying drawings here, which are incorporated in the specification and constitute a part of the specification, show embodiments according to the present disclosure and serve to explain principles of the disclosure together with the specification.

In order to more clearly illustrate embodiments of the disclosure or technical solutions in the related art, drawings that need to be used in description of the embodiments or the related art are briefly introduced below, and it will be apparent to those of ordinary skill in the art that other drawings may be obtained based on these drawings without inventive work.

DETAILED DESCRIPTION

In order to describe technical solutions of embodiments of the present disclosure more clearly, detailed description of the present disclosure will be described below with reference to the accompanying drawings. Obviously, the drawings to be described below are merely some embodiments of the disclosure. For those of ordinary skill in the art, other drawings and other embodiments can be obtained based on these drawings without inventive work.

In order to make the drawings brief, each figure only schematically shows parts related to the present disclosure and does not represent an actual structure as a product. In addition, in order to make the drawings brief and easy to understand, with respect to components with the same structure or function in some figures, only one thereof is schematically drawn or marked. Herein, "a/an" does not only mean "only one", but also mean the case of "more than one".

The present disclosure will be further described in detail with reference to the accompanying drawings and embodiments.

Figure 1:
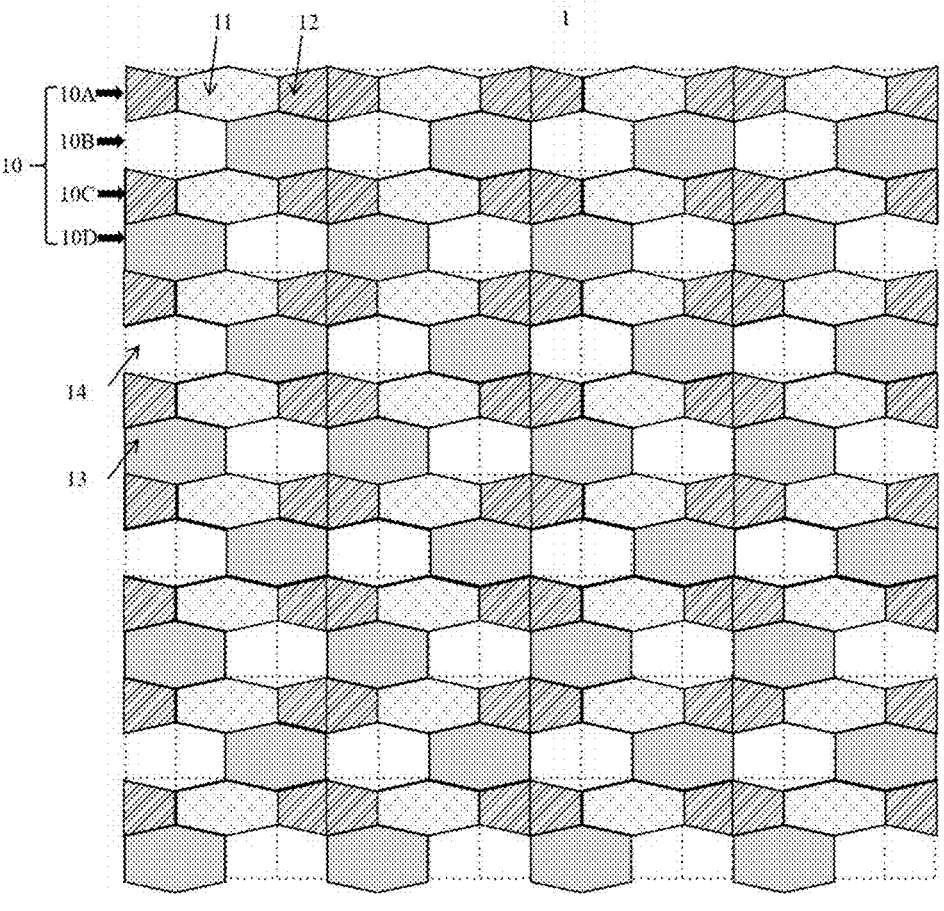
FIG. 1 is a schematic diagram of an array substrate according to an embodiment of the present disclosure.

As shown in FIG. 1, an array substrate 1 according to an embodiment of the present disclosure comprises a substrate and a plurality of pixel units 10 arranged in an array on the substrate, the pixel cell 10 comprising a first row sub-pixel group 10A, a second row sub-pixel group 10B, a third row sub-pixel group 10C, and a fourth row sub-pixel group 10D arranged sequentially in a column direction. The first row sub-pixel group 10A and the third row sub-pixel group 10C each comprise at least one first color sub-pixel 11 and at least one second color sub-pixel 12, and the second row sub-pixel group 10B and the fourth row sub-pixel group 10D each comprise at least one third color sub-pixel 13 and at least one transparent sub-pixel 14.

Wherein, a plurality of the pixel units 10 adjoin each other and are arranged in a column sequentially in a first direction, and a plurality of the pixel units 10 adjoin each other and are arranged in a column sequentially in a second direction.

In some embodiments, each of the pixel units 10 comprises a plurality of the first color sub-pixels 11, a plurality of the second color sub-pixels 12, a plurality of the third color sub-pixels 13, and a plurality of the transparent sub-pixels 14. The first color sub-pixel 11 and the second color sub-pixel 12 in the same row are arranged alternately, and the third color sub-pixel 13 and the transparent sub-pixel 14 in the same row are arranged alternately. The first color sub-pixel 11, the second color sub-pixel 12, the third color sub-pixel 13, and the transparent sub-pixel 14 each are a polygon which refers to a shape comprising at least three sides.

In detail, the first color sub-pixel 11 and the second color sub-pixel 12 are in the same row, and the third color sub-pixel 13 and the transparent sub-pixel 14 are in the same row, thereby spacing the transparent sub-pixels 14 apart by the third color sub-pixels 13. When the array substrate 1 is applied to the display panel, the interlacing display effect can be prevented, while intensity of diffraction of light beams emitted by the first color sub-pixel 11, the second color sub-pixel 12 and the third color sub-pixel 13 at the transparent sub-pixel 14 can be reduced by setting the transparent sub-pixel 14 as a polygon, thereby enhancing the perspective effect of the transparent sub-pixel 14. Meanwhile, in order to fit the polygon of the transparent sub-pixel 14, the first color sub-pixel 11, the second color sub-pixel 12 and the third color sub-pixel 13 are also set as a polygon, so that arrangements of the first color sub-pixel 11, the second color sub-pixel 12 and the third color sub-pixel 13 on the array substrate 1 can be more simplified.

In the array substrate 1 according to an embodiment of the present disclosure, the transparent sub-pixel 14 and the third color sub-pixel 13 are arranged alternately in the same row so as to space a plurality of the transparent sub-pixels 14 apart by the third color sub-pixels 13, thereby preventing a visual effect of a user from being affected.

In some embodiments, the third color sub-pixel 13 of the second row sub-pixel group 10B is in the same column as the transparent sub-pixel 14 of the fourth row sub-pixel group 10D, and the transparent sub-pixel 14 of the second row sub-pixel group 10B is in the same column as the third color sub-pixel 13 of the fourth row sub-pixel group 10D. This enables the transparent sub-pixel 14 of the second row sub-pixel group 10B and the transparent sub-pixel 14 of the fourth row sub-pixel group 10D to be better spaced apart, thereby enhancing the display effect of the display panel.

In some embodiments, the first color sub-pixel 11 in the first row sub-pixel group 10A is in the same column as the first color sub-pixel 11 in the third row sub-pixel group 10C, and the second color sub-pixel 12 in the first row sub-pixel group 10A is in the same column as the second color sub-pixel 12 in the third row sub-pixel group 10C, thereby simplifying the arrangement of the first color sub-pixel 11 and the second color sub-pixel 12.

In some embodiments, the area of the first color sub-pixel 11 is equal to the area of the second color sub-pixel 12, the area of the third color sub-pixel 13 is equal to the area of the transparent sub-pixel 14, and the area of the transparent sub-pixel 14 is larger than the area of the first color sub-pixel 11. This can increase the area of the transparent sub-pixel 14 and improve transmittance of the display panel when the array substrate 1 is applied to the display panel.

In the array substrate according to an embodiment of the present disclosure, the area of the transparent sub-pixel 14 is larger than or equal to the area of the third color sub-pixel 13, the area of the third color sub-pixel 13 is larger than or equal to the area of the first color sub-pixel 11, and the area of the first color sub-pixel 11 is larger than the area of the second color sub-pixel 12. This can increase the area of the transparent sub-pixel 14 and improve transmittance of the display panel when the array substrate 1 is applied to the display panel.

In some embodiments, the color of the first color sub-pixel 11 is red, the color of the second color sub-pixel 12 is green, and the color of the third color sub-pixel 13 is blue. Since brightness of green, red, and blue increases sequentially, in the case of the same area, a lifetime of green is the longest, a lifetime of red is the second longest, and a lifetime of blue is the shortest. Therefore, the area of the third color sub-pixel 13, the area of the first color sub-pixel 11, and the area of the second color sub-pixel 12 are set to decrease sequentially, thereby extending service lives of the first color sub-pixel 11 and the third color sub-pixel 13, wherein the area of the third color sub-pixel 13 is the same as the area of the transparent sub-pixel 14.

In some embodiments, in one of the pixel units 10, the first row sub-pixel group 10A and the third row sub-pixel group 10C each comprise one first color sub-pixel 11 and two second color sub-pixels 12, and the second row sub-pixel group 10B and the fourth row sub-pixel group 10D each comprise one third color sub-pixel 13 and one transparent sub-pixel 14; the two second color sub-pixels 11 in the first row sub-pixel group 10A and the third row sub-pixel group 10C are located on both sides of the first color sub-pixel 12.

In some embodiments, sides of the third color sub-pixel 13 that adjoin the first color sub-pixel 11 and the second color sub-pixel 12 are protruded in the column direction, sides of the transparent sub-pixel 14 that adjoin the first color sub-pixel 11 and the second color sub-pixel 12 are protruded in the column direction. This can increase the area of the third color sub-pixel 13 and the transparent sub-pixel 14, and the increase in the area of the third color sub-pixel 13 can prolong the service life of the third color sub-pixel 13; the increase in the area of the transparent sub-pixel 14 can increase light transmittance of the display panel. In addition, this can simplify image shape settings of the adjacent first color sub-pixel 11 and second color sub-pixel 12 and can simplify image shape settings of the transparent sub-pixel 14 and the third color sub-pixel 13.

In some embodiments, the first color sub-pixel 11 is an axisymmetric image, wherein one axis of symmetry of the first color sub-pixel 11 extends in a first direction, and another axis of symmetry of the first color sub-pixel 11 extends in a second direction. In one of the pixel units 10, two second color sub-pixels 12 in the same column are mirror symmetric with respect to the axis of symmetry of the first color sub-pixel 11 in the second direction.

In some embodiments, the first color sub-pixel 11, the third color sub-pixel 13, and the transparent sub-pixel 14 each are a hexagon, and the second color sub-pixel 12 is an isosceles trapezoid. This can simplify image shape settings of the adjacent first color sub-pixel 11 and second color sub-pixel 12 and can simplify image shape settings of the transparent sub-pixel 14 and the third color sub-pixel 13.

In some embodiments, the array substrate 1 further comprises a plurality of data line groups arranged in parallel, each of the data line groups comprising a first data line 21, a second data line 22, a third data line 23, and a fourth data line 24 arranged sequentially in a row direction. In one of the pixel units 10, in the column direction, two second color sub-pixels 12 at a start end in the same column are electrically connected to the first data line 21, and other two second color sub-pixels 12 at a terminate end in the same column are electrically connected to the fourth data line 24. One of the second data line 22 and the third data line 23 is electrically connected to the two first color sub-pixels 11, and the other thereof is electrically connected to the two third color sub-pixels 13, so that the structure arrangement of the array substrate 1 can be simplified.

First Embodiment

Figure 2:
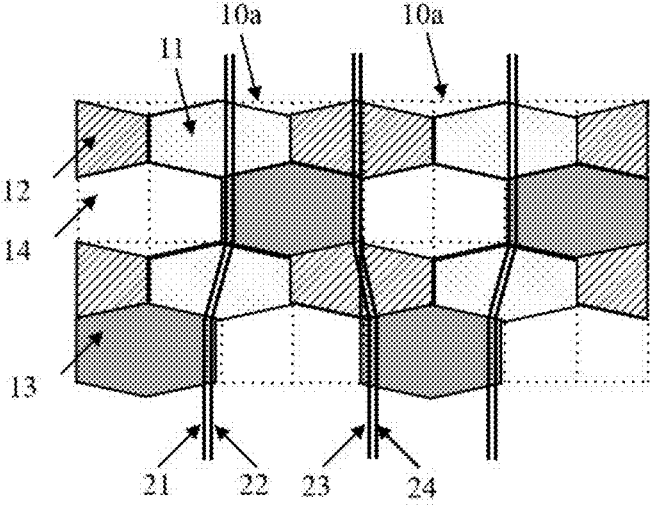
FIG. 2 is a schematic diagram of a pixel unit of an array substrate according to an embodiment of the present disclosure.
Figure 3:
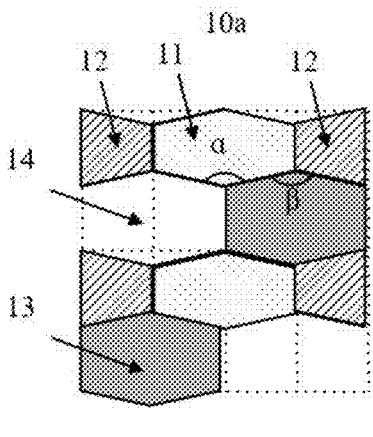
FIG. 3 is another schematic diagram of a pixel unit of an array substrate according to an embodiment of the present disclosure.

As shown in FIGS. 1 to 3, the array substrate 1 comprises the substrate and a plurality of the pixel units 10 (pixel units 10a in FIG. 2 and FIG. 3, that is, the pixel unit 10 in FIG. 1 is the same as the pixel unit 10a in FIG. 2 and FIG. 3) on the substrate, each of the pixel cell 10 comprising two first color sub-pixels 11, four second color sub-pixels 12, two third color sub-pixels 13, and two transparent sub-pixels 14, and the pixel cell 10 comprises the first row sub-pixel group 10A, the second row sub-pixel group 10B, the third row sub-pixel group 10C, and the fourth row sub-pixel group 10D arranged sequentially. The first row sub-pixel group 10A and the third row sub-pixel group 10C each comprise one first color sub-pixel 11 and two second color sub-pixels 12, and the two second color sub-pixels 12 in the same row are respectively located on two sides of the first color sub-pixel 11. The second row sub-pixel group 10B and the fourth row sub-pixel group 10D each comprise one third color sub-pixel 13 and one transparent sub-pixel 14, and the third color sub-pixel 13 of the second row sub-pixel group 10B is in the same column as the transparent sub-pixel 14 of the fourth row sub-pixel group 10D, and the transparent sub-pixel 14 of the second row sub-pixel group 10B is in the same column as the third color sub-pixel 13 of the fourth row sub-pixel group 10D.

As shown in FIGS. 1 and 3, shapes of the first color sub-pixel 11, the third color sub-pixel 13, and the transparent sub-pixel 14 are symmetrical and hexagonal, and the shape of the second color sub-pixel 12 is an isosceles trapezoid, which can simplify fabrication of the array substrate 1.

The area of the first color sub-pixel 11 is larger than the area of the second color sub-pixel 12, the area of the third color sub-pixel 13 is equal to the area of the transparent sub-pixel 14, the area of the transparent sub-pixel 14 is larger than the area of the first color sub-pixel 11, the area of the third color sub-pixel 13 is larger than the area of the first color sub-pixel 11, so that the area of the transparent sub-pixel can be increased, the light transmittance of the display panel can be increased.

As shown in FIG. 3, an interior angle of sides of the first color sub-pixel 11 that adjoin the third color sub-pixel 13 and the transparent sub-pixel 14 is α, an interior angle of sides of the third color sub-pixel 13 that adjoin the first color sub-pixel 11 and the second color sub-pixel 12 is β, and α and β are equal and satisfy: $120° < α = β < 180°$, where α and β may be 130°, 140°, 150°, 160°, 170°, and the like. An interior angle of sides of the transparent sub-pixel 14 that adjoin the first color sub-pixel 11 and the second color sub-pixel 12 is the same as β. The larger α and β are, the narrower the first color sub-pixel 11, the second color sub-pixel 12, the third color sub-pixel 13 and the transparent sub-pixel 14 are in the row direction and the wider in the column direction, which shortens a distance between adjacent data lines and increases difficulty of a fabrication process. Thus, suitable α and β enable ratios of the first color sub-pixel 11, the second color sub-pixel 12, the third color sub-pixel 13 and the transparent sub-pixel 14 in the row direction and the column direction to be suitable, which can simplify the process.

As shown in FIGS. 1 and 3, the first color sub-pixel 11 in the first row sub-pixel group 10A is in the same column as the first color sub-pixel 11 in the third row sub-pixel group 10C correspondingly, and the second color sub-pixel 12 in the first row sub-pixel group 10A is in the same column as the second color sub-pixel 12 in the third row sub-pixel group 10C correspondingly.

The first color sub-pixel 11 is red, the second color sub-pixel 12 is green, and the third color sub-pixel 13 is blue.

In one of the pixel units 10, in the column direction, two second color sub-pixels 12 at a start end in the same column are electrically connected to the first data line 21, and other two second color sub-pixels 12 at a terminate end in the same column are electrically connected to the fourth data line 24. The second data line 22 is electrically connected to the two second color sub-pixels 12, and the third data line 23 is electrically connected to the two third color sub-pixels 13.

Second Embodiment

A structure of the embodiment is the same as the above structure, and is not repeated here.

In one of the pixel units 10, in the column direction, two second color sub-pixels 12 at a start end in the same column are electrically connected to the first data line 21, and other two second color sub-pixels 12 at a terminate end in the same column are electrically connected to the fourth data line 24. The third data line 23 is electrically connected to the two first color sub-pixels 11, and the second data line 22 is electrically connected to the two third color sub-pixels 13.

A transparent organic light emitting display panel according to the present embodiment comprises the array substrate 1.

In the transparent organic light emitting display panel according to the present embodiment, the transparent sub-pixel 14 and the third color sub-pixel 13 are arranged alternately in the same row so as to space a plurality of the transparent sub-pixels 14 apart by the third color sub-pixels 13, thereby preventing a visual effect of a user from being affected.

In the description of the present disclosure, it should be understood that an orientation or position relationship indicated by the terms "upper", "lower", "left", "right", "inner", "outer", "axial", "radial", "circumferential" and the like is an orientation or position relationship shown in the drawings merely for convenience of describing the disclosure and simplifying the description, rather than indicating or implying that the device or element referred to must have a particular orientation and be configured and operated in a particular orientation, and thus should not be construed as limiting the disclosure. In addition, features defined with "first" and "second" may comprise one or more of the features explicitly or implicitly. In the description of the disclosure, "a plurality of" means two or more unless otherwise stated.

In the description of the disclosure, it should be noted that the terms "mount", "couple" and "connect" should be understood broadly unless otherwise explicitly specified or defined, for example, fixed connection, detachable connection, or integral connection; mechanical connection or electrical connection; direct connection or indirect connection via an Intermediary; or internal connection between two elements. The specific meanings of the above terms in the disclosure may be understood in specific circumstances by those skilled in the art.

In description of the specification, description of the terms "one embodiment", "some embodiments", "an illustrative embodiment", "an example", "a specific example", "some examples" and the like means that a specific feature, structure, material, or characteristic described in combination with the embodiment or example is comprised in at least one embodiment or example of the present disclosure. In the specification, an illustrative recitation of the above terms does not necessarily refer to the same embodiment or example. Furthermore, the specific feature, structure, material or characteristic described may be combined in any suitable manner in any one or more embodiments or examples.

What is claimed is:

1. An array substrate comprising a substrate and a plurality of pixel units arranged in an array on the substrate, the pixel units comprising a first row sub-pixel group, a second row sub-pixel group, a third row sub-pixel group, and a fourth row sub-pixel group arranged in a column direction, the first row sub-pixel group and the third row sub-pixel group each comprising at least one first color sub-pixel and at least one second color sub-pixel, and the second row sub-pixel group and the fourth row sub-pixel group each comprising at least one third color sub-pixel and at least one transparent sub-pixel;

wherein the third color sub-pixel of the second row sub-pixel group is in the same column as the transparent sub-pixel of the fourth row sub-pixel group, and the transparent sub-pixel of the second row sub-pixel group is in the same column as the third color sub-pixel of the fourth row sub-pixel group;

in one of the pixel units, the first row sub-pixel group and the third row sub-pixel group each comprise one first color sub-pixel and two second color sub-pixels, and the second row sub-pixel group and the fourth row sub-pixel group each comprise one third color sub-pixel and one transparent sub-pixel; and the two second color sub-pixels in the first row sub-pixel group and the third row sub-pixel group are located on both sides of the first color sub-pixel.

2. The array substrate of claim 1, wherein each of the pixel units comprises a plurality of the first color sub-pixels, a plurality of the second color sub-pixels, a plurality of the third color sub-pixels, and a plurality of the transparent sub-pixels, the first color sub-pixel and the second color sub-pixel in the same row are arranged alternately, and the third color sub-pixel and the transparent sub-pixel in the same row are arranged alternately.

3. The array substrate of claim 2, wherein the first color sub-pixel, the second color sub-pixel, the third color sub-pixel, and the transparent sub-pixel each are a polygon.

4. The array substrate of claim 1, wherein the first color sub-pixel in the first row sub-pixel group is in the same column as the first color sub-pixel in the third row sub-pixel group, and the second color sub-pixel in the first row sub-pixel group is in the same column as the second color sub-pixel in the third row sub-pixel group.

5. The array substrate of claim 1, wherein the area of the first color sub-pixel is larger than the area of the second color sub-pixel, the area of the third color sub-pixel is equal to the area of the transparent sub-pixel, and the area of the transparent sub-pixel is larger than the area of the first color sub-pixel.

6. The array substrate of claim 1, wherein the area of the transparent sub-pixel is larger than or equal to the area of the third color sub-pixel, the area of the third color sub-pixel is larger than or equal to the area of the first color sub-pixel, and the area of the first color sub-pixel is larger than the area of the second color sub-pixel.

7. The array substrate of claim 1, wherein sides of the third color sub-pixel that adjoin the first color sub-pixel and the second color sub-pixel are protruded in the column direction, and sides of the transparent sub-pixel that adjoin the first color sub-pixel and the second color sub-pixel are protruded in the column direction.

8. The array substrate of claim 7, wherein the first color sub-pixel is an axisymmetric image, one axis of symmetry of the first color sub-pixel extends in a first direction, and another axis of symmetry of the first color sub-pixel extends in a second direction, in one of the pixel units, the two second color sub-pixels in the same column are mirror symmetric with respect to the axis of symmetry of the first color sub-pixel in the second direction.

9. The array substrate of claim 7, wherein the first color sub-pixel, the third color sub-pixel and the transparent sub-pixel each are an axisymmetric shape and a hexagon, and the second color sub-pixel is an isosceles trapezoid.

10. The array substrate of claim 9, wherein an interior angle of sides of the first color sub-pixel that adjoin the third color sub-pixel and the transparent sub-pixel is $\alpha$, an interior angle of sides of the third color sub-pixel that adjoin the first color sub-pixel and the second color sub-pixel is $\beta$, and $\alpha$ and $\beta$ satisfy: $120° < \alpha = \beta < 180°$.

11. The array substrate of claim 10, wherein the color of the first color sub-pixel is one of red and green, the color of the second color sub-pixel is the other of red and green, and the color of the third color sub-pixel is blue.

12. The array substrate of claim 11, further comprising a plurality of data line groups extending in the column direction, each of the data line groups comprising a first data line, a second data line, a third data line, and a fourth data line arranged sequentially in a row direction, wherein in one of the pixel units, in the column direction, the two second color sub-pixels at a start end in the same column are electrically connected to the first data line, and the other two second color sub-pixels at a terminate end in the same column are electrically connected to the fourth data line, one of the second data line and the third data line is electrically connected to the two first color sub-pixels, and the other of the second data line and the third data line is electrically connected to the two third color sub-pixels.

13. A transparent organic light emitting display panel comprising an array substrate comprising a substrate and a plurality of pixel units arranged in an array on the substrate, the pixel units comprising a first row sub-pixel group, a second row sub-pixel group, a third row sub-pixel group, and a fourth row sub-pixel group arranged in a column direction, the first row sub-pixel group and the third row sub-pixel group each comprising at least one first color sub-pixel and at least one second color sub-pixel, and the second row sub-pixel group and the fourth row sub-pixel group each comprising at least one third color sub-pixel and at least one transparent sub-pixel;

wherein the third color sub-pixel of the second row sub-pixel group is in the same column as the transparent sub-pixel of the fourth row sub-pixel group, and the transparent sub-pixel of the second row sub-pixel group is in the same column as the third color sub-pixel of the fourth row sub-pixel group;

in one of the pixel units, the first row sub-pixel group and the third row sub-pixel group each comprise one first color sub-pixel and two second color sub-pixels, and the second row sub-pixel group and the fourth row sub-pixel group each comprise one third color sub-pixel and one transparent sub-pixel; and the two second color sub-pixels in the first row sub-pixel group and the third row sub-pixel group are located on both sides of the first color sub-pixel.

*    *    *    *    *